(12) United States Patent
Oguri et al.

(10) Patent No.: US 6,329,677 B1
(45) Date of Patent: Dec. 11, 2001

(54) FIELD EFFECT TRANSISTOR

(75) Inventors: Hiroyuki Oguri; Teruo Yokoyama, both of Yamanashi-ken (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/330,087

(22) Filed: Jun. 11, 1999

(30) Foreign Application Priority Data

Nov. 9, 1998 (JP) .................................................. 10-317940

(51) Int. Cl.$^7$ ................................................ H01L 31/0328
(52) U.S. Cl. ............................................ 257/194; 257/408
(58) Field of Search ..................................... 257/194, 408

(56) References Cited

U.S. PATENT DOCUMENTS 5,831,306 * 11/1998 Gardner et al. ...................... 257/408
6,020,604 * 2/2000 Kikkawa ............................... 257/194

FOREIGN PATENT DOCUMENTS

| 60-136381 | 7/1985 | (JP) . |
| 61-100968 | 5/1986 | (JP) . |
| 62-51269 | 3/1987 | (JP) . |
| 7-153779 | 6/1995 | (JP) . |

* cited by examiner

Primary Examiner—Mark V. Prenty
(74) Attorney, Agent, or Firm—Armstrong, Westerman, Hattori, McLeland & Naughton, LLP

(57) ABSTRACT

A field effect transistor has a semiconductor lamination structure, a Schottky contact gate electrode and source/drain ohmic electrodes disposed on both sides of the gate electrode on the lamination structure, source/drain regions disposed under the source/drain electrodes, a channel layer disposed in the lamination structure spaced apart from the principal surface and connecting the source/drain regions, a barrier layer disposed in the lamination structure between the channel layer and the principal surface and having a conduction band edge energy higher than the channel layer, and a pair of impurity doped regions formed in the barrier layer and channel layer continuously with the source/drain regions on both sides of the gate electrode, wherein a carrier density in the barrier layer is lower than a carrier density in the channel layer in the impurity doped region. A filed effect transistor and its manufacture method are provided which can lower the source resistance of the field effect transistor while the gate breakdown voltage is maintained high.

6 Claims, 7 Drawing Sheets

FIELD EFFECT TRANSISTOR

This application is based on Japanese patent application HEI 10-317940 filed on Nov. 9, 1998, the whole contents of which are incorporated herein by reference.

BACKGROUND OF THE INVENTION a) Field of the Invention

The present invention relates to a field effect transistor and its manufacture, and more particularly to a field effect transistor capable of having a sufficiently high gate breakdown voltage and a low source resistance and to its manufacture.

b) Description of the Related Art

A field effect transistor has a source electrode, a gate electrode and a drain electrode on a semiconductor active region with a channel region. A gate voltage applied to the gate electrode controls current flowing through the source-drain electrodes. In most of field effect transistors made of compound semiconductor, the source and drain electrodes have ohmic contacts on the semiconductor surface in the active region and the gate electrode has a Schottky contact on the semiconductor surface in the active region. Such a field effect transistor made of compound semiconductor will be described hereinunder.

In a field effect transistor having a Schottky gate electrode, leak current is likely to flow between the gate electrode and the ohmic source-drain electrodes. In order to increase the conductivity of the channel region, a forward voltage is applied to the gate electrode. The forward voltage is a voltage having a polarity opposite to that of carriers to be transferred, e.g., a positive voltage if an n-channel transistor is used. A forward gate breakdown voltage is represented by Vf when the forward voltage is applied. In order to extinguish the conductivity of the channel region, a reverse voltage is often applied to the gate electrode, e.g., a negative voltage if an n-channel transistor is used. The reverse gate breakdown voltage is represented by Vr when the reverse voltage is applied.

If a normally-on type field effect transistor whose channel region is normally on is used, only a reverse voltage may be applied to the gate electrode. However, if the conductivity of the channel region is to be improved, it is desired to apply a forward voltage to the gate electrode.

If a normally-off type field effect transistor whose channel region is normally off is used, only a forward voltage may be applied to the gate electrode to turn on the channel region. However, if the off-state is to be made more stable, it is desired to apply a reverse voltage to the gate electrode. It is therefore desired that both the forward and reverse breakdown voltages Vf and Vr are high.

In order to increase a saturation current Imax of a field effect transistor, it is desired that the resistance of a current path between the source-drain electrodes is low. A depletion layer is often formed in the current path between the gate electrode and the drain electrode. In such a case, the resistance of the current path is mainly governed by the resistance between the source electrode and the channel region under the gate electrode, i.e., a source resistance Rs. In order to increase the saturation current Imax by reducing the source resistance, it is desired to lower the resistance between the channel region which is controlled by the potential of the gate electrode and the source region under the source electrode which has generally a high impurity concentration.

Generally, a field effect transistor is often operated by exchanging the functions of the source and drain electrodes. To satisfy such requirements, a field effect transistor is designed to have the source and drain electrodes disposed symmetrically with the gate electrode, so that the same transistor performance can be obtained even if the functions of the source and drain electrodes are exchanged. The source electrode can therefore be used as the drain electrode, and vice versa.

As a method of lowering the source resistance Rs in order to increase the saturation current Imax, impurity ions are implanted into the semiconductor region between the gate electrode and ohmic electrode and activated to increase the conductivity. This structure is, however, likely to increase the leak current between the gate electrode and ohmic electrode and lower the gate breakdown voltages Vf and Vr.

Another method of lowering the source resistance Rs is to shorten the distance between the gate electrode and ohmic electrode. However, the short distance between the gate electrode and ohmic electrode is also likely to lower the gate breakdown voltages Vf and Vr.

Reducing the source resistance Rs and keeping the gate breakdown voltages Vf and Vr are more or less contradictory, and it is difficult to satisfy both the requirements.

The source resistance of a field effect transistor having a Schottky gate electrode is difficult to be lowered while the gate breakdown voltages are maintained high.

SUMMARY OF THE INVENTION

It is an object of the present invention to provide a field effect transistor capable of lowering the source resistance while the gate breakdown voltages are maintained sufficiently high.

According to one aspect of the present invention, there is provided a field effect transistor comprising: a semiconductor lamination structure having a principal surface; a gate electrode disposed on the principal surface and forming a Schottky contact with the principal surface; a pair of source/drain electrodes disposed on the principal surface on both sides of the gate electrode and each forming an ohmic contact with the principal surface; a pair of source/drain regions disposed in the semiconductor lamination structure under the pair of source/drain electrodes and each forming a current deriving region; a channel layer disposed in the semiconductor lamination structure spaced apart from the principal surface and disposed to be connected to the pair of source/drain regions; a barrier layer disposed in the semiconductor lamination structure between the channel layer and the principal surface and having a conduction band edge energy higher than a conduction band edge energy of the channel layer; and a pair of impurity doped regions formed in the barrier layer and the channel layer continuously with the pair of source/drain regions on both sides of the gate electrode, a carrier density in the barrier layer being lower than a carrier density in the channel layer, in the pair of impurity doped regions.

According to another aspect of the present invention, there is provided a method of manufacturing a field effect transistor comprising the steps of: preparing a lamination substrate having a lamination structure formed on a semiconductor substrate, the lamination structure including a channel layer having a first conduction band edge energy and a barrier layer formed on the channel layer, the barrier layer having a second conduction band edge energy higher than the first conduction band edge energy; forming a gate electrode on a surface of the lamination structure of the lamination substrate; doping impurities into the lamination structure in intermediate regions on both sides of the gate electrode; and activating the impurities under conditions that a first carrier density in the channel layer becomes higher than a second carrier density in the barrier layer.

The lamination structure of a channel layer and a barrier layer is formed in an active region, and in the regions on both sides of the gate electrode, the channel region is formed to have a relatively high carrier density and the barrier layer is formed to have a relatively low carrier density. In this manner, a low source resistance can be realized while the gate breakdown voltage is maintained high.

As above, in a region between the source/drain regions below the gate electrode, a high resistivity barrier layer is maintained, while a low resistivity region is formed under the barrier layer, extending toward the gate electrode from the source/drain region. The source resistance can therefore be lowered while the gate breakdown voltages are maintained high.

DETAILED DESCRIPTION OF THE PREFERRED EMBODIMENTS

Figure 1:
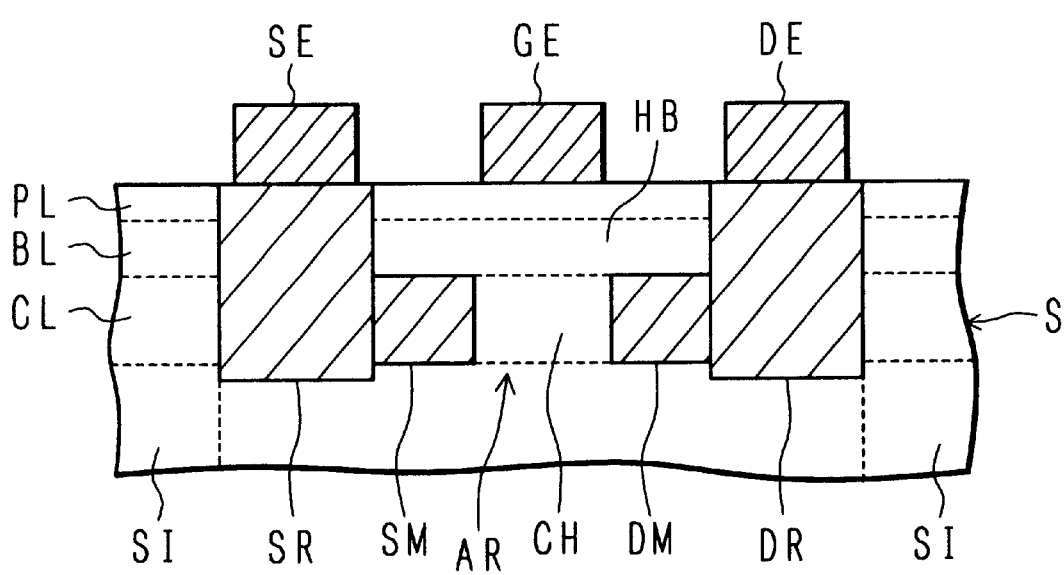
FIG. 1 is a cross sectional view of a substrate schematically showing the structure of a field effect transistor according to a first embodiment of the invention.

FIG. 1 is a schematic cross sectional view of a field effect transistor according to a fundamental embodiment of the invention. A semiconductor substrate S has a lamination of a channel layer CL and a barrier layer BL. The channel layer CL has a low energy of the conduction band edge easy to realize a high conductivity, and the barrier layer BL has a high energy of the conduction band edge capable of forming a potential barrier. A protective layer PL for protecting the surface of the barrier layer BL may be formed on the barrier layer BL. The protective layer PL has a thickness equal to or smaller than that of the surface depletion layer to be formed. These layers are typically made of group III–V compound semiconductor.

In the embodiment shown in FIG. 1, a semi-insulating region SI is formed by doping Cr or implanting oxygen ions, the semi-insulating region SI surrounding an active region AR. A gate electrode GE forms a Schottky contact on the surface of the active region AR of the semiconductor substrate. A source electrode SE and a drain electrode DE forming ohmic contacts are formed on both sides of the gate electrode GE.

A source region SR is formed under the source electrode SE, passing through the protective layer PL, barrier layer BL and channel layer CL, the source region SR having a high carrier density. Similarly, a drain region DR is formed under the drain electrode DE, passing through the protective layer PL, barrier layer BL and channel layer CL, the drain region DR having a high carrier density.

The source region SR and drain region DR having the high carrier density constitute low resistivity regions. A region just under the gate electrode is not positively doped with impurities or is lightly doped with impurities to form a low carrier density region.

A region of the channel layer CL just under the gate electrode GE forms a channel region CH. Between the channel region CH and source region SR of the channel layer CL, a source extension region SM is formed which has a relatively high carrier density.

Similarly, between the channel region CH and the drain region DR of the channel layer CL, a drain extension region DM is formed which has a relatively high carrier density. Presence of the source extension region SM and drain extension region DM lowers a source resistance RS.

The barrier layer BL has a carrier density lower than that of the source and drain extension regions SM and DM also in the regions on both sides of the gate electrode. Therefore, this low carrier density barrier layer BL extending under the gate electrode GE broader than the width of the gate electrode GE forms a high resistivity barrier region HB. Presence of the high resistivity barrier region HB maintains the breakdown voltages of the gate electrode high.

If the exposed surface of the barrier layer BL is likely to be oxidized and the characteristics of the barrier layer are to be changed easily, it is preferable to cover the surface of the barrier layer BL with the protective layer PL.

In realizing the above-described structure, the channel layer CL and barrier layer BL are made of different materials. The channel layer CL is preferably made of material which is easy to activate impurities. The barrier layer BL is preferably made of material which is more difficult to activate impurities than the channel layer CL. Impurity ions are implanted into the channel layer CL and barrier layer BL made of such materials by using the gate electrode GE as a mask, and impurity ions are selectively activated so that the carrier density of the channel layer CL can be made high while the barrier layer BL is maintained at a low carrier density.

The source region SR and drain region DR under the ohmic electrodes SE and DE are doped with sufficient impurities and activated sufficiently in order to avoid a high contact resistance and to lower the resistance. With these processes, the resistivity in the vertical direction can be lowered even if the barrier layer BL exists under the ohmic electrodes SE and DE. More specific embodiments will be described hereinunder.

FIGS. 2A to 2D are cross sectional views of a substrate of a field effect transistor illustrating the main manufacture processes and structure thereof according to the second embodiment of the invention.

Figure 2A:
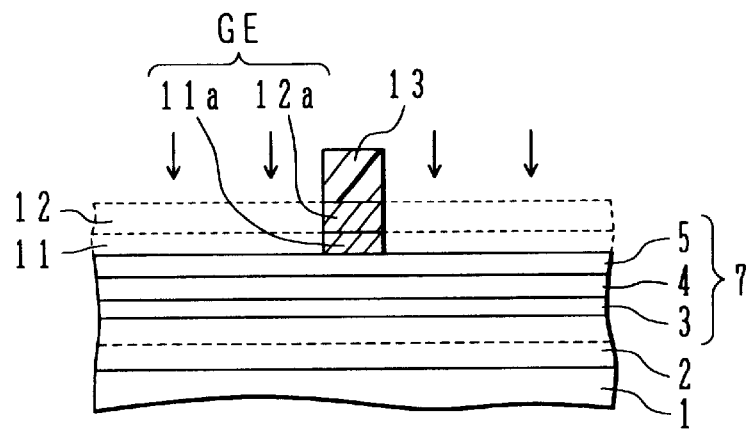
FIGS. 2A to 2D are cross sectional views of a substrate schematically showing the manufacture processes of a field effect transistor according to a second embodiment of the invention.

As shown in FIG. 2A, on the surface of a GaAs substrate 1, a buffer layer 2 is formed which is a lamination of a GaAs layer and an AlGaAs layer. Then, an i-type InGaAs channel layer 3, an i-type AlGaAs barrier layer 4 and an i-type GaAs protective layer 5 are epitaxially grown (these layers 3, 4 and 5 are collectively called a lamination structure 7). The buffer layer 2 and epitaxial lamination structure 7 may be grown by MOCVD, molecular beam epitaxy, or the like. The i-type InGaAs channel layer 3 is grown to a thickness of 15 nm, for example. The i-type AlGaAs barrier layer 4 is grown to a thickness of 20 nm, for example. The i-type GaAs protective layer 5 is grown to a thickness of 20 nm, for example. The channel layer may be formed of $In_yGa_{1-y}As$ (1>y>0) and the barrier layer may be formed of $Al_xGa_{1-x}As$ (1>x≧0.2). Both the channel and barrier layers may be expressed as $Al_xIn_yGa_{1-x-y}As$(x≧0, y≧0, x+y<1).

On the surface of the epitaxial lamination structure 7, a WSi layer 11 and a W layer 12 are sequentially laminated in order to form a gate electrode. This lamination may be formed by sputtering, vapor deposition, CVD or the like.

A photoresist pattern 13 is formed on the W layer 12 in order to pattern the W layer 12 and WSi layer 11 and form a gate electrode. By using this photoresist pattern 13 as an etching mask, the W layer 12 and WSi layer 11 are etched by dry etching or the like to form a gate electrode GE made of a lamination of a WSi layer 11a and a W layer 12a. The photoresist pattern 13 is thereafter removed.

Figure 2B:
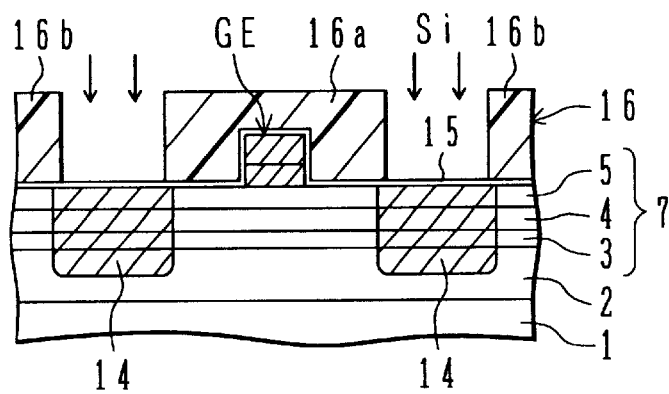

As shown in FIG. 2B, on the surface of the epitaxial lamination structure 7 with the gate electrode GE, a silicon nitride (SiN) layer 15 is formed by sputtering, CVD or the like. On the surface of the SiN layer 15, a photoresist pattern 16 is formed which is constituted of a portion 16a covering the gate electrode GE and portions 16b covering surfaces on both sides of the gate electrode GE via openings. These openings of the photoresist pattern 16 define source and drain regions.

By using the photoresist pattern 16 as a mask, Si ions of n-type impurity are implanted at an acceleration energy of 50 keV and a dose of $2\times10^{13}$ cm$^{-2}$ (preferably $2\times10^{-}$cm$^{-2}$ or higher). Ion doped regions 14 formed under the above conditions are high impurity concentration regions. The photoresist pattern 16 and SiN layer 15 are thereafter removed.

Figure 2C:
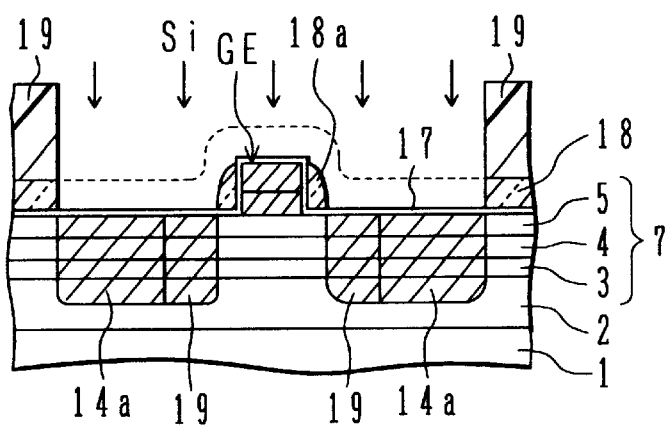

As shown in FIG. 2C, on the surface of the epitaxial lamination structure 7, an AlN layer 17 is formed by sputtering, and an $SiO_2$ layer 18 is formed on the AlN layer 17 by CVD. On the surface of the $SiO_2$ layer 18, a photoresist pattern 19 is formed which has an opening corresponding to the active region where a field effect transistor is formed. The $SiO_2$ layer 18 exposed in the opening is anisotropically etched by reactive ion etching (RIE) or the like to etch back the $SiO_2$ layer on the flat surface and leave $SiO_2$ side spacers 18a only on the side walls of the gate electrode GE. Under the conditions that the side spacers 18a of insulating material are formed on the side walls of the gate electrode GE, Si ions of n-type impurity are implanted.

A dose of this ion implantation is set lower than that of the ion implantation for the source and drain regions shown in FIG. 2B. For example, ion implantation is performed at an acceleration energy of 50 keV and a dose of $1\times10^{13}$ cm$^{-2}$ (preferably at a dose from $1\times10^{12}$ cm$^{-2}$ to $1.5\times10^{13}$ cm$^{-2}$). After the photoresist pattern 19 is removed, annealing is performed for about 10 seconds at 850° C. (preferably for about 5 to 30 seconds at 750 to 900° C.).

With this annealing, impurities in the high impurity concentration source/drain regions 14a and in a relatively low impurity concentration region 19 between the region under the gate electrode and the source/drain regions 14a are activated. However, since annealing is performed under the conditions of a relatively low temperature and a relatively short time, impurities in the barrier layer 4 in the region 19 are not activated sufficiently although impurities in the channel layer 3 in the region 19 are activated sufficiently. Thereafter, the AlN layer 17 and upper $SiO_2$ layer 18 are removed.

Figure 2D:
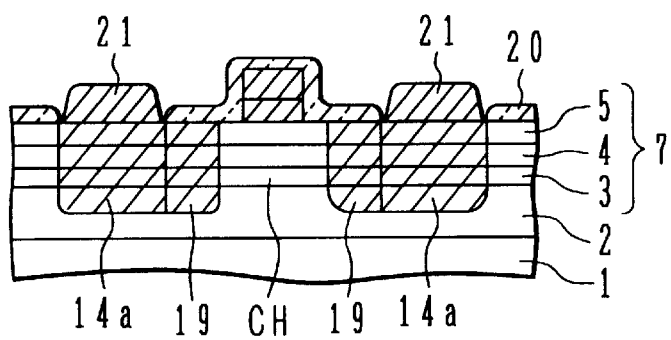

As shown in FIG. 2D, on the surface of the epitaxial lamination structure 7, an SiN layer 20 is formed and openings are formed through this SiN layer 20 in the area where the source/drain regions are formed, by selective etching using a photoresist pattern. Next, a metal layer is vapor-deposited for forming ohmic electrodes, and the photoresist pattern is removed to lift off the ohmic electrode layer on the photoresist pattern. Source/drain electrodes 21 are therefore left on the source/drain regions 14a. The ohmic electrode layer is a lamination of, for example, an AuGe layer, an Ni layer and an Au layer stacked in this order from the bottom.

Since impurity ions were doped at a high concentration under the ohmic electrodes 21, the high conductivity source/drain regions 14a are formed under the ohmic electrodes to thereby realize sufficiently low contact resistance. Between the channel region CH in the channel layer CL under the gate electrode and the source/drain regions 14a, impurities were doped at the process of FIG. 2C and sufficiently activated in the channel layer 3 to form the low resistivity regions. Therefore, the source resistance Rs of the field effect transistor can be lowered.

In the barrier layer 4 of the ion implanted region 19, impurity ions are not activated sufficiently and the high resistivity state is maintained. Such a difference of activation results from that the channel layer 3 is made of InGaAs and the barrier layer 4 is made of AlGaAs. Since the AlGaAs layer of high resistivity is formed under the gate electrode, the breakdown voltages of the gate electrode can be maintained high. Leak current between the ohmic electrodes and gate electrode can therefore be maintained low.

AlGaAs has a broader band gap than InGaAs so that it contributes to improve the gate breakdown voltages.

A field effect transistor manufactured under the embodiment conditions as described above, showed a forward gate breakdown voltage Vf of about 1.7 V (at Ig=0.5 mA/mm), a reverse or backward gate breakdown voltage Vr of about −13 V (at Ig=−0.5 mA/mm), a saturation current Imax of about 330 mA/mm (at Vds=3 V and Vgs=2.5 V), and an ohmic contact resistance Rc of about 0.18 Ω·mm (ohmic contact resistivity p of about 0.81 $\mu\Omega\cdot cm^2$).

In this embodiment, the whole surface of the AlGaAs layer 4 is covered with the GaAs layer 5 to prevent deterioration to be caused by oxidation. Furthermore, since the surface has a planar structure, the manufacture processes are simple. A field effect transistor of high reliability and high performance can be manufactured.

FIGS. 3A to 3E are cross sectional views of a substrate of a field effect transistor illustrating the manufacture processes and structure thereof according to the third embodiment of the invention.

Figure 3A:
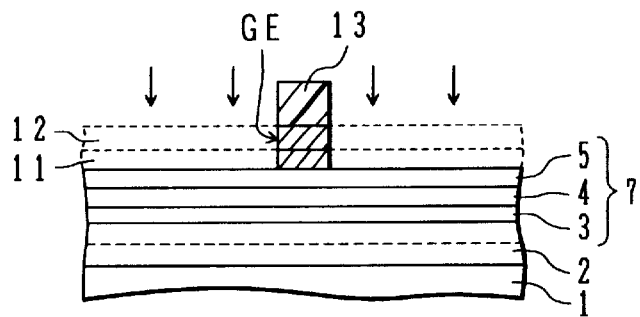
FIGS. 3A to 3E are cross sectional views of a substrate schematically showing the manufacture processes of a field effect transistor according to a third embodiment of the invention.

As shown in FIG. 3A, on the surface of a GaAs substrate 1, a buffer layer 2 is formed which is a lamination of a GaAs layer and an AlGaAs layer. Then, an i-type InGaAs layer 3, an i-type AlGaAs layer 4 and an i-type GaAs layer 5 are epitaxially grown to form a lamination structure 7. The i-type InGaAs layer 3 is a channel layer having a thickness of about 15 nm, the i-type AlGaAs layer 4 is a barrier layer having a thickness of about 20 nm, and the i-type GaAs layer 5 is a protective layer having a thickness of about 20 nm. On the surface of the protective layer 5, a WSi layer 11 and a W layer 12 are sequentially laminated in order to form a gate electrode. A photoresist pattern 13 is formed on the W layer 12 to etch the W layer 12 and WSi layer 11 and leave a gate electrode GE. The photoresist pattern 13 is removed thereafter. This structure is similar to that shown in FIG. 2A.

Figure 3B:
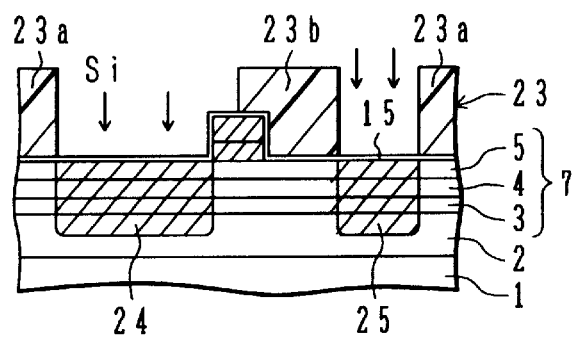

As shown in FIG. 3B, an SiN layer 15 is deposited by CVD, sputtering or the like, the SiN layer 15 covering the surfaces of the gate electrode GE and protective layer 5. A photoresist pattern 23 is formed on the SiN layer 15. The photoresist pattern 23 is constituted of a portion 23a surrounding the transistor and a portion 23b extending from a middle area of the gate electrode to the drain side region. Namely, the photoresist pattern 23b covers the drain active region from just under the edge of the gate electrode toward the drain region by a predetermined width.

By using this photoresist pattern 23 as a mask, Si ions of n-type impurity are implanted at an acceleration energy of 50 keV and a dose of $2 \times 10^{13}$ cm$^{-2}$ (preferably $2 \times 13^{13}$ cm$^{-2}$ or higher). This ion implantation forms an impurity doped region 24 to be used as the source region and an impurity doped region 25 to be used as the drain region. The impurity doped region 24 on the source side is formed slightly creeping under the gate electrode. The photoresist pattern 23 is removed thereafter.

Figure 3C:
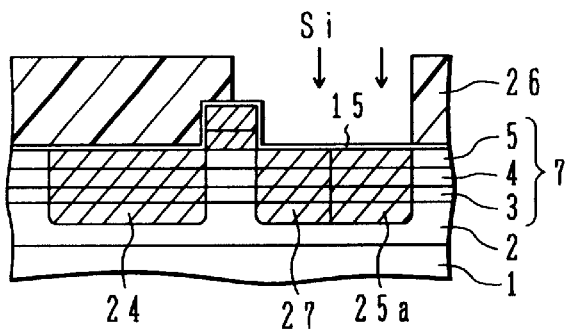

As shown in FIG. 3C, a new photoresist pattern 26 is formed on the SiN film 15. The photoresist pattern has an opening exposing a region from a middle area of the gate electrode to the whole drain region. By using the photoresist pattern 26 as a mask, Si ions of n-type impurity are implanted at a very low concentration, e.g., a dose of $1 \times 10^{12}$ cm$^{-2}$, and at an acceleration energy of 50 keV (preferably at a dose of about $1 \times 10^{12}$ to about $1 \times 10^{13}$ cm$^{-2}$).

This ion implantation forms an impurity doped region 27 having a very low n-type impurity concentration adjacent to the drain region on the gate electrode side. With this ion implantation, the drain impurity doped region 25 formed earlier is also doped with ions to form an impurity doped region 25a having an impurity concentration slightly increased. The impurity doped region 27 has a very low impurity concentration of about $\frac{1}{20}$ of the impurity concentration of the impurity doped regions 24 and 25a. Thereafter, the photoresist pattern 26 and SiN layer 15 are removed.

Figure 3D:
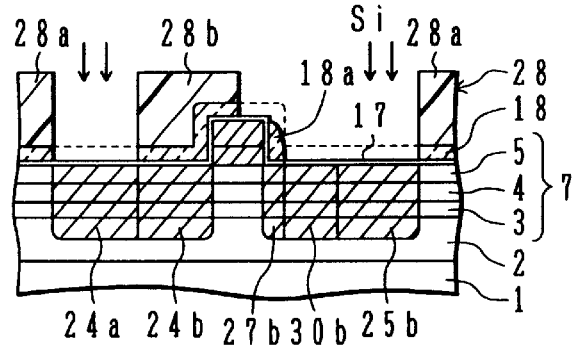

As shown in FIG. 3D, an AlN layer 17 and an SiO$_2$ layer 18 are deposited on the surfaces of the gate electrode GE and protective layer 5. A photoresist pattern 28 is formed on the SiO$_2$ layer 18. The photoresist pattern 28 is constituted of a portion 28a covering the outside of the element region and a portion covering a region from the middle area of the gate electrode toward the source region.

By using the photoresist pattern 28 as a mask, the SiO$_2$ layer 18 on the flat surface is anisotropically etched by RIE or the like. This anisotropic etching leaves a side spacer 18a on the side wall of the gate electrode GE on the drain side. After the side spacer 18a is formed, Si ions of n-type impurity are again implanted at an acceleration energy of 50 keV and a dose of $1 \times 10^{15}$ cm$^{-2}$ (preferably about $5 \times 10^{12}$ to $2 \times 10^{13}$ cm$^{-2}$) to form a medium impurity concentration region 30b.

The source impurity doped region 24 has therefore a high impurity concentration region 24a further doped with impurities and a region 24b having the impurity concentration given at the ion implantation of FIG. 3B. The drain region 25b and 30b also obtain an increased impurity concentration. The high impurity concentration regions 24a and 25b have an impurity concentration higher than that of the impurity doped region 24b.

Between the gate electrode and drain electrode, the impurity doped region having the low impurity concentration given at the ion implantation of FIG. 3C is left as a region 27b under the side spacer 18a and a medium impurity concentration region 30b is formed outside of the side spacer 18a. The drain region 25a becomes a region 25b with an increased impurity concentration. Thereafter, the photoresist pattern 28 and side spacer 18a are removed.

By using an AlN layer 17 as a cap layer, annealing is performed for 10 seconds at 850° C. to activate the impurities (preferably for 5 to 30 seconds at 750 to 900° C.). The high impurity concentration regions 24a and 25b become source and drain regions having a sufficiently low resistivity. The medium impurity concentration region 24b is formed between the high impurity concentration 24a on the source side and the gate electrode. On the drain side, a low impurity concentration region 27b is formed under the side spacer 18a and the medium impurity concentration region 30b is formed adjacent to the low impurity concentration region 27b between the gate electrode and high impurity concentration drain region 25b.

In the barrier layer 4, impurities in the low impurity concentration region 27b and medium impurity concentration regions 24b and 30b are not activated sufficiently to thus maintain a high resistance state.

Thereafter, the AlN layer 17 is removed and a new SiN layer 20 is deposited. A photoresist pattern is formed on the SiN layer 20. By using this photoresist pattern as a mask, the SiN layer 20 on the source region 24a and drain region 25b are etched and removed.

On this semiconductor structure, an ohmic electrode layer of a lamination of, for example, an AuGe layer, an Ni layer and an Au layer is formed thereon by sputtering, vapor deposition or the like. The ohmic electrode layer on the photoresist pattern is removed through lift-off.

Figure 3E:
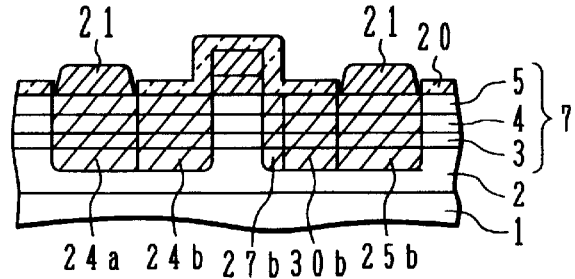

With the above processes, a field effect transistor shown in FIG. 3E is formed. On the source region side, the InGaAs channel layer 3 has a low resistivity in the region to just under the edge of the gate electrode so that the source resistance Rs can be reduced effectively and a large drain current Imax can be obtained.

On the drain region side, the region adjacent to the gate electrode is the n region 27b with an impurity concentration suppressed low so that the gate-drain breakdown voltage Vgdo can be maintained high. Impurity ions implanted in the barrier layer 4 are not activated sufficiently so that the resistivity of the barrier layer beneath the gate electrode can be maintained high. Presence of the n region barrier layer on the drain side is effective for maintaining the gate breakdown voltages high.

A field effect transistor manufactured under the embodiment conditions as described above showed a forward gate breakdown voltage Vf of about 1.7 V (at Ig=0.5 mA/mm), a reverse or backward gate breakdown voltage Vr of about −12 V (at Ig=−0.5 mA/mm), a saturation current Imax of about 360 mA/mm (at Vds=3 V and Vgs=2.5 V), and an ohmic contact resistance Rc of about 0.19 Ω·mm (ohmic contact resistivity p of about 0.90 $\mu\Omega\cdot$cm$^2$). As compared to the characteristic values of the second embodiment, the characteristic values of the third embodiment verify the effects of presence of the high resistance barrier layer (HB). Namely, the source extension region (SM) and drain extension region (DM) become nearer to the gate electrode by an amount corresponding to the thickness of the SiO$_2$ side spacer so that Vr and Vf are not lowered. A shortened distance between SM and DM increases Imax.

FIGS. 4A to 4D are cross sectional views of a substrate of a field effect transistor illustrating the main manufacture processes and structure thereof according to the fourth embodiment of the invention.

Figure 4A:
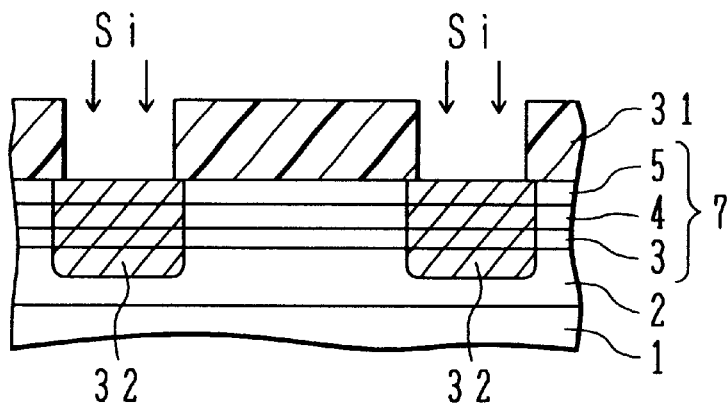
FIGS. 4A to 4D are cross sectional views of a substrate schematically showing the manufacture processes of a field effect transistor according to a fourth embodiment of the invention.

Similar to the above embodiments, as shown in FIG. 4A, on the surface of a GaAs substrate 1, a buffer layer 2 is formed which is a lamination of a GaAs layer and an AlGaAs layer. Then, an i-type InGaAs channel layer 3 is formed on the buffer layer 2 to a thickness of about 15 nm, an i-type AlGaAs barrier layer 4 is formed on the channel layer 3 to a thickness of about 20 nm, and an i-type GaAs protective layer 5 is formed on the barrier layer 4 to a thickness of about 20 nm. On the surface of the protective layer 5, a photoresist pattern 31 is formed having openings corresponding to source and drain regions. By using this photoresist pattern 31 as a mask, n-type impurity ions Si are implanted at an acceleration energy of 50 keV and a dose of $2\times10^{13}$ cm$^{-2}$.

Thereafter, the photoresist pattern 31 is removed and an AlN layer is deposited to a thickness of about 100 nm by sputtering to form a cap layer for annealing. In this state, annealing is performed for 10 seconds at 850° C. (preferably for 5 seconds or longer at 750 to 900° C.). With this annealing, source/drain regions 32 of a low resistivity are formed. Thereafter, the AlN layer is removed.

Figure 4B:
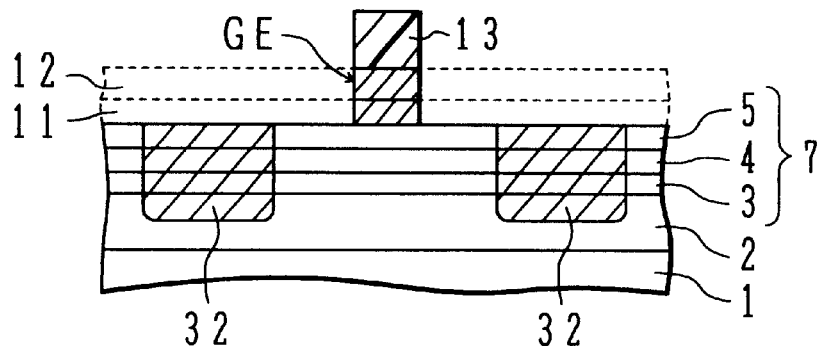

As shown in FIG. 4B, on the surface of the protective layer 5, a WSi layer 11 and a W layer 12 are sequentially laminated by sputtering, vapor deposition, CVD or the like, and a photoresist pattern 13 is formed on the W layer 12. The photoresist pattern 13 is formed in the middle area between the source/drain regions 32 where a gate electrode is formed. By using the photoresist pattern 13 as a mask, the W layer 12 and WSi layer 11 are etched to form a gate electrode GE. Thereafter, the photoresist pattern 13 is removed.

Figure 4C:
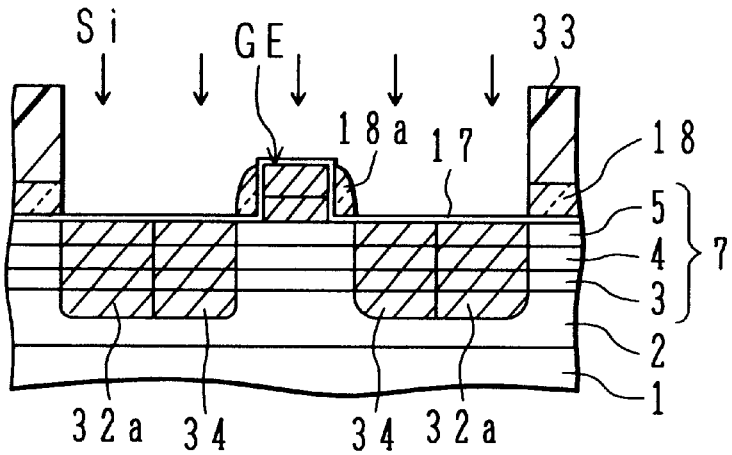

As shown in FIG. 4C, an AlN layer 17 and an SiO$_2$ layer 18 are deposited on the surfaces of the gate electrode GE and protective layer 5. A photoresist pattern 33 is formed on the SiO$_2$ layer 18. The photoresist pattern 33 covers the outside of the element region. By using the photoresist pattern 33 as a mask, the SiO$_2$ layer 18 on the flat surface is anisotropically etched. This anisotropic etching leaves side spacers 18a of SiO$_2$ on the side walls of the gate electrode GE.

Thereafter, by using the photoresist pattern 33, gate electrode GE, side spacers 18a as a mask, n-type impurity ions Si are implanted at an acceleration energy of 50 keV and a dose of $1\times10^{13}$ cm$^{-2}$. With this ion implantation, impurity doped regions 34 having a medium impurity concentration are formed on both sides of the gate electrode structure.

The impurity concentration of the source/drain regions formed at the process of FIG. 4A increases further to form high impurity concentration source/drain regions 32a. Thereafter, the photoresist pattern 33 and SiO$_2$ layer 18 (including the side spacers 18a) are removed.

In this state, annealing is performed for 10 seconds at 750° C. (preferably for 5 to 30 seconds at 750° C. or lower) to activate the impurities implanted at the process of FIG. 4C. Under these activation conditions, the impurities in the channel layer 3 are activated and those in the barrier layer 4 are not sufficiently activated. Thereafter, the AlN layer 17 is removed.

Figure 4D:
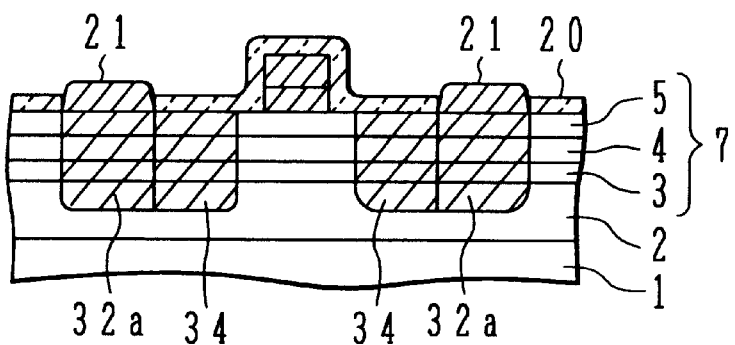

As shown in FIG. 4D, an SiN insulating layer 20 is formed on the surface of the semiconductor substrate, and a photoresist pattern is formed on the SiN layer 20 to selectively etch the SiN layer 20. On the surface of this semiconductor structure, an ohmic electrode layer of a lamination of an AuGe layer, an Ni layer and an Au layer is formed and the ohmic electrode layer on the photoresist pattern is removed through lift-off to leave source/drain electrodes 21 on the source/drain regions 32a.

In this embodiment, first, ions are implanted into the source/drain regions and activated. The gate electrode is not still formed at this stage so that the annealing conditions can be determined without considering the heat resistance properties of the gate electrode. If annealing is performed for a long time at a high temperature, implanted impurity ions can be activated sufficiently so that the regions of a low resistivity can be formed. Therefore, the contact resistance of the source/drain electrodes can be lowered. Furthermore, material having a low heat resistance can be used as the gate electrode material.

The second annealing is performed for a short time at a low temperature so that the resistance of only the channel layer can be lowered while the barrier layer is maintained at a high resistivity. With these processes, a field effect transistor having a low source resistance can be formed while the breakdown voltages of the gate electrode are maintained high.

As a modification of the fourth embodiments shown in FIGS. 4A to 4D, the following manufacture processes may be adopted.

First, after the high impurity concentration source/drain regions 32 are formed as shown in FIG. 4A, an SiO$_2$ layer is formed by CVD as a cap layer for annealing. Annealing is performed under the-conditions of 30 minutes and 850° C. instead of the conditions of 10 seconds and 850° C. With this annealing for a longer time at a high temperature, impurity ions in the impurity doped regions 32 can be activated sufficiently so that the source/drain regions having a lower resistivity can be formed. Thereafter, similar processes to those shown in FIGS. 4B to 4D are preformed to form a field effect transistor.

With such annealing conditions, the high impurity concentration regions under the ohmic electrodes become regions whose implanted impurity ions are activated sufficiently. The contact resistance can therefore be lowered.

The second annealing conditions are set so that impurity ions are not activated sufficiently. Therefore, although the impurity ions implanted into the channel layer are activated sufficiently, the impurity ions implanted into the barrier layer are not activated sufficiently so that a high resistivity of the barrier layer can be maintained. This region of the high resistivity extends from under the gate electrode toward the source/drain regions so that leak current of the gate electrode lowers and the gate breakdown voltages can be improved.

The band gap of the barrier layer larger than that of the channel layer also contributes to improve the gate breakdown voltages. The planar structure improves the reliability of manufacture processes. Material having a low heat resistance can be used as the gate electrode material.

Figure 5A:
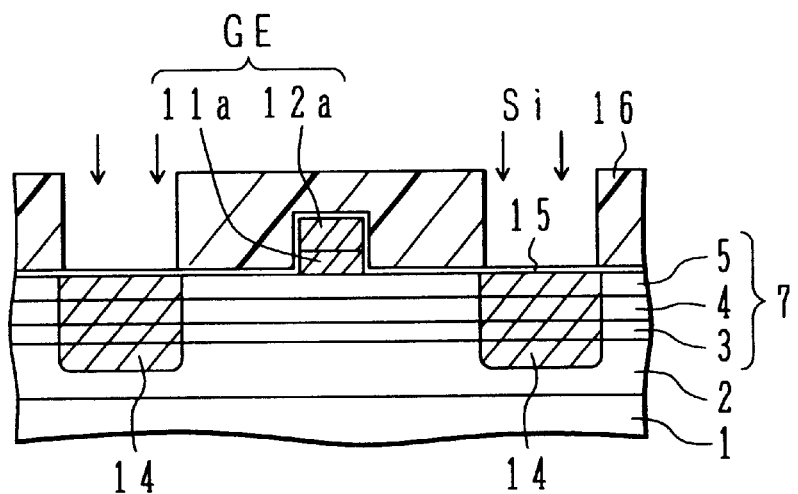
FIGS. 5A to 5C are cross sectional views of a substrate schematically showing the manufacture processes of a field effect transistor according to a fifth embodiment of the invention.
Figure 5B:
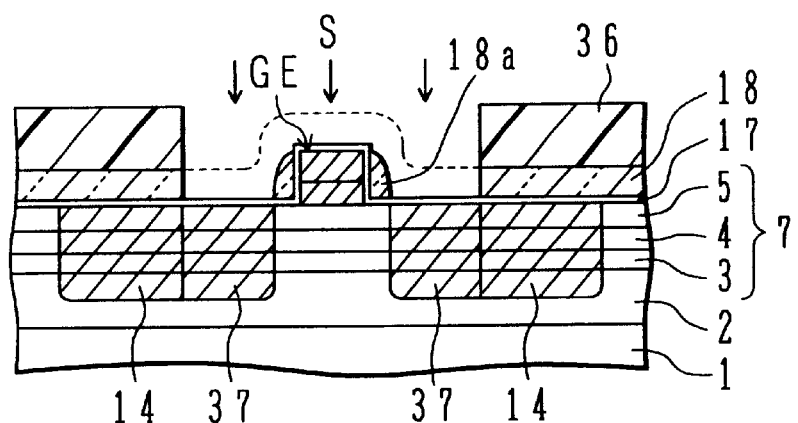
Figure 5C:
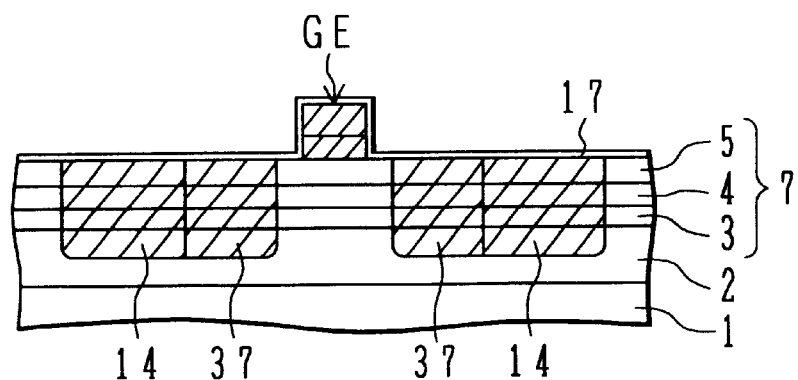

FIGS. 5A to 5C are cross sectional views of a substrate of a field effect transistor illustrating the manufacture processes and structure thereof according to the fifth embodiment of the invention.

Similar to the above embodiments, as shown in FIG. 5A, on the surface of a GaAs substrate 1, a buffer layer 2 made of a lamination of a GaAs layer and an AlGaAs layer, an i-type InGaAs channel layer 3, an i-type AlGaAs barrier layer 4, and an i-type GaAs protective layer 5 are epitaxially grown. A gate electrode GE made of a WSi layer 11a and a W layer 12a is formed on the surface of the protective layer 5, by processes similar to those of the above embodiments.

An SiN layer 15 is deposited covering the surfaces of the gate electrode GE and protective layer 5, and a photoresist pattern 16 is formed on the SiN layer 15. The photoresist pattern 16 has openings in the areas corresponding to source/drain regions.

By using this photoresist pattern 16 as a mask, n-type impurity ions Si are implanted at an acceleration energy of 50 keV and a dose of $2\times10^{13}$ cm$^{-2}$ to form high impurity concentration regions 14. Thereafter, the photoresist pattern 16 and SiN layer 15 are removed.

As shown in FIG. 5B, an AlN layer 17 and an SiO$_2$ layer 18 are deposited on the surfaces of the gate electrode GE and protective layer 5. A photoresist pattern 36 having an opening exposing the element region is formed on the SiO$_2$ layer 18. By using the photoresist pattern 36 as a mask, the SiO$_2$ layer 18 is anisotropically etched to leave side spacers 18a on the side walls of the gate electrode.

In this state, n-type impurity ions S are implanted at an acceleration energy of 50 keV and a dose of $2\times10^{13}$ cm$^{-2}$. As compared to Si, n-type impurities S are not likely to be activated and the activation rate changes greatly with the material of an ion implanted layer.

After n-type impurity ions S are implanted, the photoresist pattern 36 and SiO$_2$ layer 18 (including the side spacers 18a) are removed. In this state, as shown in FIG. 5C, annealing is performed for 10 seconds at 850° C. by using an AlN layer 17 as a cap layer for annealing.

With this annealing, impurities in the high impurity concentration regions 14 and in the S doped regions 37 of the channel layer 3 are activated sufficiently, and impurities in the S doped regions 37 of the barrier layer 4 are not activated sufficiently. Therefore, the S doped regions 37 of the barrier layer 4 are maintained at a high resistivity.

Thereafter, processes similar to those of the fourth embodiment are performed to form a field effect transistor. As the impurities which greatly change the activation rate according to the conditions, Se, Te or the like may be used instead of S.

In this embodiment, the activation conditions of n-type impurities S greatly change with the material of the impurity doped region. Therefore, the carrier densities can be changed greatly between the barrier layer and channel layer. By leaving the barrier layer of a high resistivity under the gate electrode, high gate breakdown voltages can be obtained.

The band gap of the barrier layer larger than that of the channel layer also contributes to improving the gate breakdown voltages. The planar structure of a transistor improves the reliability of manufacture processes, similar to the above-described embodiments.

FIGS. 6A to 6D are cross sectional views of a substrate of a field effect transistor illustrating the manufacture processes and structure thereof according to the sixth embodiment of the invention.

Figure 6A:
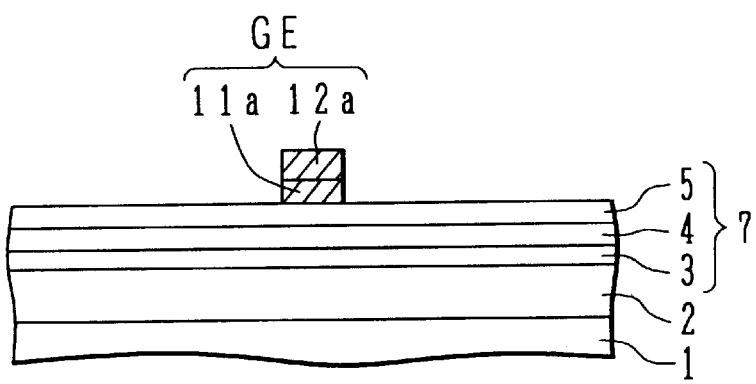
FIGS. 6A to 6D are cross sectional views of a substrate schematically showing the manufacture processes of a field effect transistor according to a sixth embodiment of the invention.

As shown in FIG. 6A, similar to the second embodiment shown in FIGS. 2A to 2D, on the surface of a GaAs substrate 1, a buffer layer 2, a channel layer 3, a barrier layer 4 and a protective layer 5 are epitaxially grown. A gate electrode GE made of a WSi layer 11a and a W layer 12a is formed on the surface of the protective layer 5.

Figure 6B:
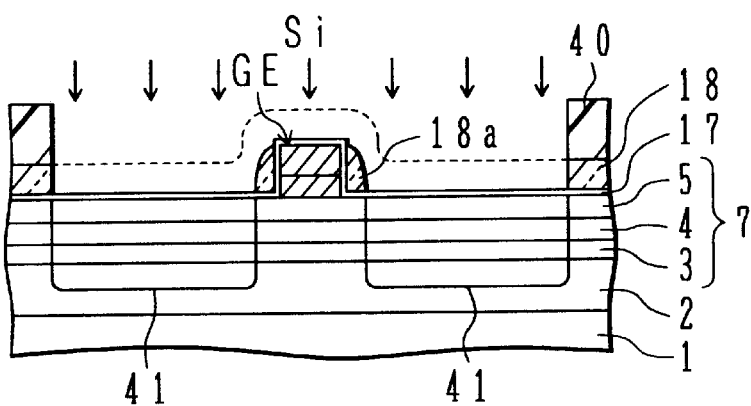

As shown in FIG. 6B, an AlN layer 17 and an SiO$_2$ layer 18 are deposited on the surfaces of the gate electrode GE and protective layer 5. A photoresist pattern 40 having an opening exposing the element region is formed on the SiO$_2$ layer 18. By using the photoresist pattern 40 as a mask, the SiO$_2$ layer 18 is anisotropically etched to leave side spacers 18a on the side walls of the gate electrode GE.

By using the photoresist pattern 40, gate electrode GE, side spacers 18a as a mask, n-type impurity ions Si are implanted at an acceleration energy of 50 keV and a dose of $2\times10^{13}$ cm$^{-2}$ to form high impurity concentration regions 41 (preferably the dose being at $2\times10^{13}$ cm$^{-2}$ or higher). Thereafter, the photoresist pattern 40 and SiO$_2$ layer 18 (including the side spacers 18a) are removed.

Figure 6C:
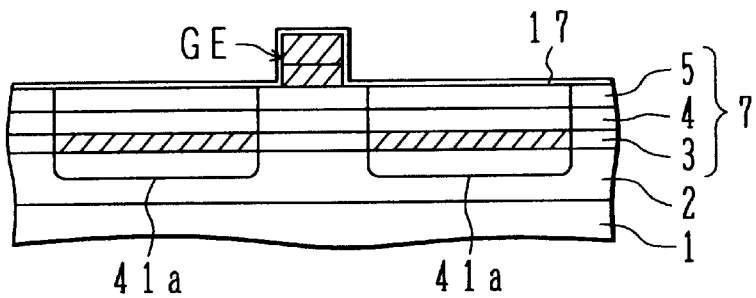

As shown in FIG. 6C, by using an AlN layer 17 as a cap layer, annealing is performed for 10 seconds at 750° C. (preferably for 5 to 30 seconds at 750° C. or lower). With these annealing conditions, only impurity ions implanted in the channel layer 3 are selectively activated, and impurities implanted in the barrier layer 4 are hardly activated. With these processes, high impurity concentration regions 41a partially activated can be formed.

Figure 6D:
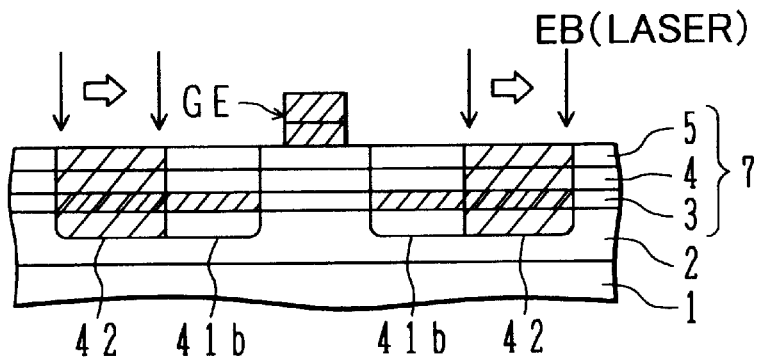

As shown in FIG. 6D, an electron beam is applied to and scanned in the regions where ohmic electrodes are formed. This electron beam radiation raises the temperature in the ohmic electrode forming regions and activates the impurities. Activation by an electron beam annealing provides a high activation rate and impurities in the region scanned with the electron beam can be activated sufficiently. In this manner, source/drain regions 42 of a low resistivity can be formed in the regions spaced apart from the gate electrode GE. In middle regions 41b not applied with the electron beam, a high resistivity of the barrier layer 4 is maintained.

Thereafter, similar to the above-described embodiments, an insulating film of SiN or the like is deposited on the substrate surface, and by using a photoresist pattern having openings corresponding to the source/drain regions, ohmic electrodes are formed through lift-off.

In this embodiment, a single process is used for doping impurities, and only desired regions can be activated sufficiently by annealing with a low activation rate (low temperature or short time, or both) and by local annealing with a high activation rate on only selected regions. Since the barrier layer 4 is maintained at a high resistivity near the gate electrode, the gate breakdown voltages can be maintained high. Similar to the above-described embodiments, a difference between band gaps improves the gate breakdown voltages, the planar structure improves the reliability of manufactures processes, and other effects can be obtained.

As annealing techniques capable of selecting annealed regions, laser annealing using a CO$_2$ laser or the like may be used in place of the electron beam annealing.

In the above embodiments, a GaAs layer having a thickness of about 20 nm is used as the protective layer 5. It is inevitable that the GaAs layer is etched depending upon the etching conditions of the gate electrode. If this GaAs protective layer is etched, the thickness of the protective layer is likely to vary in the surface area of the wafer. If the protective layer 5 is etched and the underlying barrier layer 4 is exposed, the transistor characteristics are likely to be deteriorated by oxidation with oxygen in the air or the like.

Figure 7:
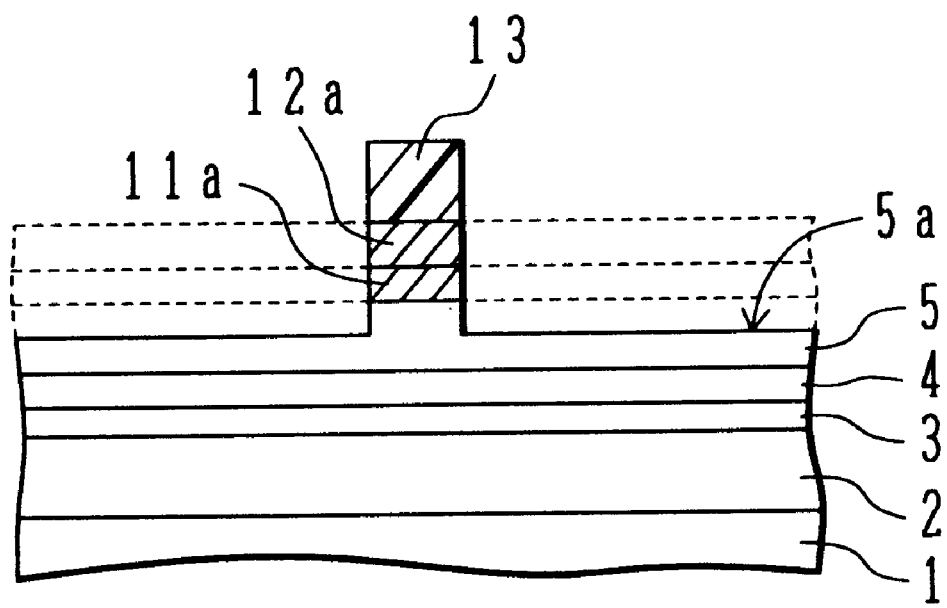
FIG. 7 is a cross sectional view of a substrate schematically showing the manufacture processes of a field effect transistor according to a modification of the embodiments.

FIG. 7 is a cross sectional view of a substrate illustrating a modification of the embodiments which is excellent in maintaining the function of the protective layer.

As shown in FIG. 7, after a buffer layer 2, a channel layer 3 and a barrier layer 4 are epitaxially grown on a substrate 1, an i-type GaAs layer having a thickness of about 50 nm thicker than that of the above embodiments is grown as a protective layer 5. On the surface of the GaAs layer 5, a gate electrode layer made of a lamination of a WSi layer and a W layer is formed, and a photoresist pattern 13 is formed on the gate electrode layer. By using the photoresist pattern 13 as a mask, the gate electrode layer is anisotropically etched under the etching conditions of a low etching selection ratio of GaAs to W/WSi to etch also the surface layer of the protective layer 5 and leave a protective layer 5a having a thickness of about 20 nm.

Thereafter, processes similar to the above embodiments, e.g., processes shown in FIGS. 2B to 2D, are performed to obtain a field effect transistor.

In this modification, the gate electrode layer can be etched under the conditions of a low etching selection ratio of the GaAs layer to the gate electrode layer. With this etching conditions, a fluctuation of an etching rate and a variation of etching in the surface area of a wafer can be suppressed, so that a danger of exposing the surface of the barrier layer 4 can be lowered.

In the embodiments described above, a lamination of a lower WSi layer and an upper W layer is used as the gate electrode. A refractory metal layer may also be used such as a W layer, a TiW layer, a TiWN layer, a WSiN layer, a TiN layer, a WN layer and a combination thereof. TiWN, WSiN and the like provide excellent heat resistance and are usable by any one of the above-described embodiments.

WSi has a relatively low heat resistance, and there is some limitation when high temperature annealing is performed. If a WSi layer is used, it is preferable to first form the source/drain regions on which ohmic electrodes are formed, as shown in FIG. 4A, and thereafter the gate electrode is formed. Another metal layer may be laminated on a gate electrode metal layer formed on the semiconductor layer. For example, an Au layer may be laminated on a WSi layer.

Various combinations of layers may be made to form the structure of a semiconductor lamination. If an AlGaAs layer is used as the barrier layer and an Al composition ratio x is of the order of 0.5, the surface of the AlGaAs layer is likely to be oxidized so that it is preferable to cover the surface of the barrier layer with the protective layer such as GaAs similar to the above-described embodiments.

If the Al composition ratio x is not larger than 0.4, the barrier layer is not likely to be oxidized and the protective layer may be omitted. If material hard to be oxidized, such as AlInGaP, is used as the barrier layer, the protective layer may be omitted. The channel layer may be made of the material which is easy to activate implanted impurities and provides a low resistivity.

A field effect transistor to be manufactured is not limited only to MESFET, but another structure such as HEMT having an n-type electron supply layer may also be used.

The present invention has been described in connection with the preferred embodiments. The invention is not limited only to the above embodiments. It will be apparent to those skilled in the art that various modifications, improvements, combinations, and the like can be made.

What is claimed is:

1. A field effect transistor comprising:
   a semiconductor lamination structure having a principal surface;
   a gate electrode disposed on the principal surface and forming a Schottky contact with the principal surface;
   a source electrode disposed on the principal surface on one side of said gate electrode and having an ohmic contact with the principal surface;
   a drain electrode disposed on the principal surface on another side of said gate electrode and having an ohmic contact with the principal surface;
   a source region disposed in said semiconductor lamination structure under said source electrode and forming a current deriving region;
   a drain region disposed in said semiconductor lamination structure under said drain electrode and forming a current deriving region;
   a channel layer disposed in said semiconductor lamination structure spaced apart from the principal surface and disposed to be connected to said source and drain regions;
   a barrier layer disposed in said semiconductor lamination structure between said channel layer and the principal surface and having a conduction band edge energy higher than a conduction band edge energy of said channel layer;
   a source impurity doped region formed in said barrier layer and said channel layer continuously with said source regions on the one side of said gate electrode, a carrier density in said barrier layer being lower than a carrier density in said channel layer, in the source impurity doped region; and
   a drain impurity doped region formed in said barrier layer and said channel layer continuously with said drain region on said another side of said gate electrode, a carrier density in said barrier layer being lower than a carrier density in said channel layer, in the drain impurity doped region,
   wherein a carrier density distribution of said source impurity doped region in a depth direction is higher than a carrier density distribution of part of said drain impurity doped region.

2. A field effect transistor according to claim 1, wherein said drain impurity doped region includes a first carrier density region formed continuously with said drain region and having a first carrier density lower than a carrier density of said drain region and a second carrier density region formed between said gate electrode and said first carrier density region and having a second carrier density lower than the first carrier density.

3. A field effect transistor according to claim 1, further comprising a surface protective layer disposed in said semiconductor lamination structure between the principal surface and said barrier layer.

4. A field effect transistor according to claim 3, wherein a thickness of said surface protective layer is equal to or thinner than a thickness of a surface depletion layer.

5. A field effect transistor according to claim 1, wherein said barrier layer and said channel layer have compositions expressed by $Al_xIn_yGa_{1-x-y}As$ ($x \geq 0$, $y \geq 0, x+y<1$).

6. A field effect transistor according to claim 5, wherein said barrier layer has compositions expressed by $Al_xGa_{1-x}As$ ($1>x\geq 0.2$) and said channel layer has compositions expressed by $In_yGa_{1-y}As$ ($1>y>0$).

* * * * *